United States Patent
Sugitani et al.

(10) Patent No.: US 12,349,558 B2
(45) Date of Patent: Jul. 1, 2025

(54) DISPLAY APPARATUS AND ELECTRONIC APPARATUS INCLUDING THE SAME

(71) Applicant: SAMSUNG DISPLAY CO., LTD., Yongin-si (KR)

(72) Inventors: Koichi Sugitani, Yongin-si (KR); Hyein Kim, Yongin-si (KR); Gwuihyun Park, Yongin-si (KR); Saehee Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 513 days.

(21) Appl. No.: 17/888,957

(22) Filed: Aug. 16, 2022

(65) Prior Publication Data

US 2023/0209943 A1    Jun. 29, 2023

(30) Foreign Application Priority Data

Dec. 27, 2021    (KR) .................. 10-2021-0188866

(51) Int. Cl.
*H10K 59/124*    (2023.01)
*G09G 3/3233*    (2016.01)
(Continued)

(52) U.S. Cl.
CPC ......... *H10K 59/124* (2023.02); *G09G 3/3233* (2013.01); *H10K 59/123* (2023.02); (Continued)

(58) Field of Classification Search
None
See application file for complete search history.

(56) References Cited

U.S. PATENT DOCUMENTS 9,099,674 B2    8/2015    Ha et al.
10,192,941 B2 *   1/2019    Sato ............... G09G 3/3266
(Continued)

FOREIGN PATENT DOCUMENTS

CN    1947464 A    *    4/2007    ......... H01L 27/3213
CN    103000639 A    *    3/2013    ........... H01L 27/322
(Continued)

OTHER PUBLICATIONS

Roslyn Tedja et al., Effect of TiO2 nanoparticle surface functionalization on protein adsorption, cellular uptake and cytotoxicity: . . . , Polymer Chemistry, Oct. 2012, pp. 2743-2751, vol. 3, No. 10, RSC Publishing.

*Primary Examiner* — Scott B Geyer
(74) *Attorney, Agent, or Firm* — CANTOR COLBURN LLP

(57) ABSTRACT

A display apparatus includes connection lines connecting pixel circuits in the non-display area to display elements in a component area, a first organic insulating layer in the component area, and a second organic insulating layer on the first organic insulating layer, where the connection lines are disposed between the first organic insulating layer and the second organic insulating layer, where an upper surface of the first organic insulating layer includes a first lens structure, where the first lens structure includes a first curved portion disposed between two connection lines adjacent to each other, and an upper surface of the second organic insulating layer includes a second lens structure, where the second lens structure includes a second curved portion overlapping the first curved portion, and a refractive index of the second organic insulating layer is different from a refractive index of the first organic insulating layer.

21 Claims, 12 Drawing Sheets

(51) Int. Cl.
  *H10K 59/123* (2023.01)
  *H10K 59/131* (2023.01)
  *H10K 59/65* (2023.01)

(52) U.S. Cl.
  CPC ......... *H10K 59/1315* (2023.02); *H10K 59/65* (2023.02); *G09G 2300/0426* (2013.01); *G09G 2300/0842* (2013.01)

(56) References Cited

U.S. PATENT DOCUMENTS

| | | | | |
|---|---|---|---|---|
| 2004/0072380 | A1* | 4/2004 | Yamazaki | H10D 86/60 438/30 |
| 2015/0380466 | A1* | 12/2015 | Koo | H10K 50/86 438/70 |
| 2017/0053971 | A1 | 2/2017 | Sato | |
| 2017/0062769 | A1* | 3/2017 | Kim | H10K 50/805 |
| 2018/0004047 | A1* | 1/2018 | Yamazaki | G02F 1/1368 |
| 2019/0251318 | A1 | 8/2019 | Jung et al. | |
| 2019/0386248 | A1* | 12/2019 | Itonaga | H10K 59/122 |
| 2020/0381495 | A1 | 12/2020 | Jeon et al. | |
| 2021/0104705 | A1* | 4/2021 | Kim | H10K 59/871 |
| 2021/0167151 | A1* | 6/2021 | Kim | H10K 71/00 |
| 2021/0202900 | A1 | 7/2021 | Lee | |
| 2023/0126988 | A1* | 4/2023 | Seong | H10K 59/124 257/40 |
| 2023/0217689 | A1* | 7/2023 | Chun | G02B 5/10 257/40 |

FOREIGN PATENT DOCUMENTS

| | | | | |
|---|---|---|---|---|
| CN | 110649081 A | | 1/2020 | |
| CN | 111370367 A | * | 7/2020 | ......... H01L 27/3246 |
| CN | 112767841 A | | 5/2021 | |
| KR | 1020210086888 A | | 7/2021 | |
| TW | 202046272 A | | 12/2020 | |

* cited by examiner

DISPLAY APPARATUS AND ELECTRONIC APPARATUS INCLUDING THE SAME

This application claims priority to Korean Patent Application No. 10-2021-0188866, filed on Dec. 27, 2021, and all the benefits accruing therefrom under 35 U.S.C. § 119, the content of which in its entirety is herein incorporated by reference.

BACKGROUND

1. Field

One or more embodiments relate to a display apparatus and an electronic apparatus including the display apparatus.

2. Description of the Related Art

Recently, the usage of display apparatuses has diversified. In addition, as display apparatuses have become thinner and lighter, the display apparatuses are more widely used in various fields.

As an area occupied by an image display area in display apparatuses increases, various functions that are combined or associated with such display apparatuses have been added.

SUMMARY

A display apparatus, with which various functions are combined or associated, may have a region for such various functions while displaying images thereon. Such a region for various functions while displaying images thereon may be desired to have a high transmittance for light, sound or the like to perform the functions thereof.

One or more embodiments include a display apparatus including a region in which various components may be disposed in a display area, having a reduced wiring resistance of the relevant region, having a reduced process risk, and simultaneously, securing a transmittance.

According to one or more embodiments, a display apparatus includes first display elements disposed in a main display area, second display elements arranged in a component area at least partially surrounded by the main display area, pixel circuits disposed in a non-display area and electrically connected to the second display elements, connection lines connecting the pixel circuits in the non-display area to the second display elements in the component area, a first organic insulating layer over a substrate in the component area, and a second organic insulating layer on the first organic insulating layer in the component area, where the connection lines are disposed between the first organic insulating layer and the second organic insulating layer, an upper surface of the first organic insulating layer includes a first lens structure, where the first lens structure includes a first curved portion disposed between two connection lines adjacent to each other among the connection lines, and an upper surface of the second organic insulating layer includes a second lens structure, where the second lens structure includes a second curved portion overlapping the first curved portion and a portion of the two connection lines adjacent to each other, and a refractive index of the second organic insulating layer is different from a refractive index of the first organic insulating layer.

In an embodiment, the refractive index of the second organic insulating layer may be greater than the refractive index of the first organic insulating layer.

In an embodiment, the display apparatus may further include a bank layer on the second organic insulating layer, where the refractive index of the second organic insulating layer may be greater than a refractive index of the bank layer, and greater than the refractive index of the first organic insulating layer.

In an embodiment, a radius of curvature of the second curved portion of the second lens structure may be greater than a radius of curvature of the first curved portion of the first lens structure.

In an embodiment, a width of the second curved portion of the second lens structure may be greater than a width of the first curved portion of the first lens structure.

In an embodiment, in a vertical cross-section, the first curved portion of the first lens structure may have a first angle with respect to an imaginary line parallel to a horizontal surface of the substrate, and in a vertical cross-section, the second curved portion of the second lens structure may have a second angle with respect to another imaginary line parallel to the horizontal surface of the substrate.

In an embodiment, the second angle of the second curved portion may be less than the first angle of the first curved portion.

In an embodiment, a width of each of the connection lines may be in a range of about 0.7 micrometer ($\mu m$) to about 1.3 $\mu m$.

In an embodiment, a refractive index of the second organic insulating layer may be about 1.7 or greater.

In an embodiment, the connection lines may include at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

According to one or more embodiments, an electronic apparatus includes a display apparatus including a main display area, a component area, and a non-display area, and a component disposed over a backside of the display apparatus and overlapping the component area, where the display apparatus includes first display elements disposed in the main display area, second display elements arranged in the component area at least partially surrounded by the main display area, pixel circuits disposed in a non-display area and electrically connected to the second display elements, connection lines connecting the pixel circuits in the non-display area to the second display elements in the component area, a first organic insulating layer disposed over a substrate in the component area, and a second organic insulating layer disposed on the first organic insulating layer in the component area, where the connection lines are disposed between the first organic insulating layer and the second organic insulating layer, an upper surface of the first organic insulating layer includes a first lens structure including a first curved portion, where the first curved portion is disposed between two connection lines adjacent to each other among the connection lines and is convex upward, and an upper surface of the second organic insulating layer includes a second lens structure including a second curved portion overlapping the first curved portion and a portion of the two connection lines adjacent to each other where the second curved portion is convex upward, and a refractive index of the second organic insulating layer is different from a refractive index of the first organic insulating layer.

In an embodiment, the refractive index of the second organic insulating layer may be greater than the refractive index of the first organic insulating layer.

In an embodiment, the display apparatus may further include a bank layer on the second organic insulating layer, where the refractive index of the second organic insulating layer may be greater than a refractive index of the bank layer, and greater than the refractive index of the first organic insulating layer.

In an embodiment, a radius of curvature of the second curved portion of the second lens structure may be greater than a radius of curvature of the first curved portion of the first lens structure.

In an embodiment, a width of the second curved portion of the second lens structure may be greater than a width of the first curved portion of the first lens structure.

In an embodiment, in a vertical cross-section, the first curved portion of the first lens structure may have a first angle with respect to an imaginary line parallel to a horizontal surface of the substrate, and in a vertical cross-section, the second curved portion of the second lens structure may have a second angle with respect to another imaginary line parallel to the horizontal surface of the substrate.

In an embodiment, the second angle of the second curved portion may be less than the first angle of the first curved portion.

In an embodiment, a width of each of the connection lines may be in a range of about 0.7 μm to about 1.3 μm.

In an embodiment, a refractive index of the second organic insulating layer may be about 1.7 or greater.

In an embodiment, the connection lines may include at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

In an embodiment, the component may include at least one selected from a camera, a speaker, a solar battery, a flash, a light-sensing sensor, and a heat-sensing sensor.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1A:
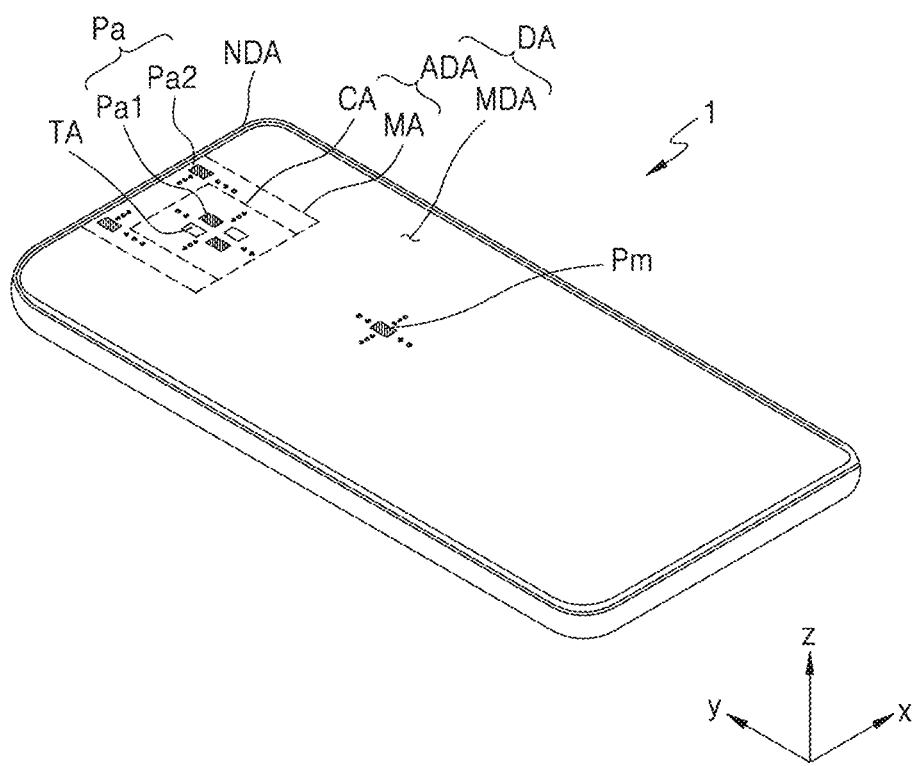
FIGS. 1A and 1B are schematic perspective views of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

"Or" means "and/or." As used herein, the term "and/or" includes any and all combinations of one or more of the associated listed items. Throughout the disclosure, the expression "at least one selected from a, b and c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an.".

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or component is referred to as being "on" another layer, region, or component, it can be directly or indirectly on the other layer, region, or component. That is, for example, intervening layers, regions, or components may be present therebetween. In contrast, when an element is referred to as being "directly on" another element, there are no intervening elements present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

As used herein, when a wiring is referred to as "extending in a first direction or a second direction," it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" or "in a cross-sectional view."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 1B:
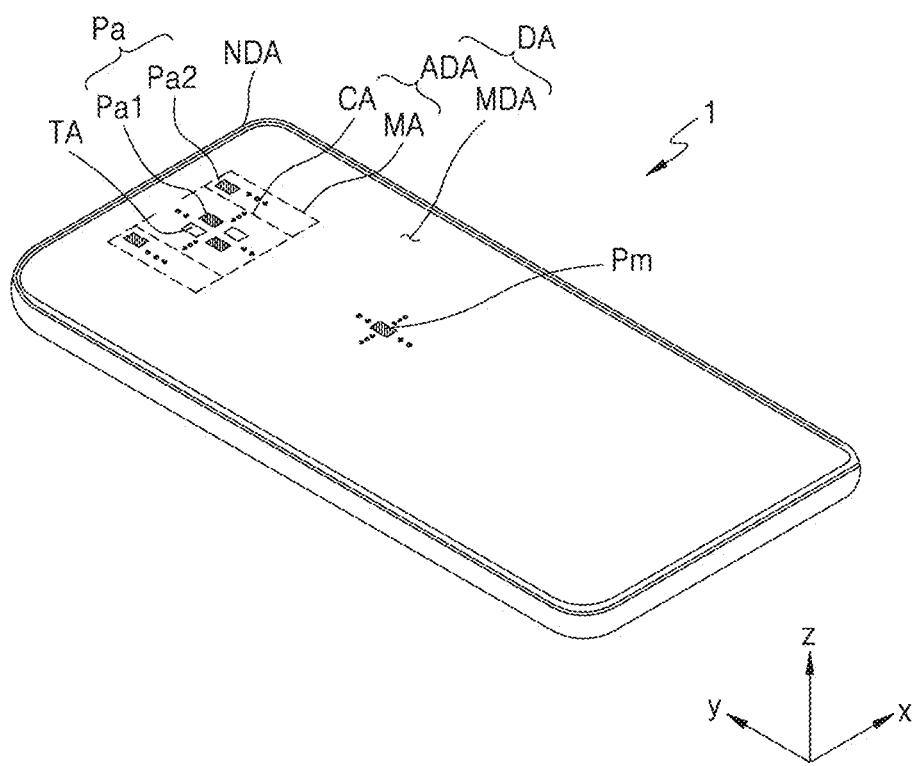

FIGS. 1A and 1B are schematic perspective views of a display apparatus according to an embodiment.

Referring to FIGS. 1A and 1B, an embodiment of a display apparatus 1 may include a display area DA and a non-display area NDA outside the display area DA. The display area DA may include an auxiliary display area ADA and a main display area MDA at least partially surrounding the auxiliary display area ADA. The auxiliary display area ADA may be configured to display auxiliary images, and the main display area MDA may be configured to display main images. The auxiliary display area ADA and the main display area MDA may be configured to display images individually or in cooperation with each other. The display area DA may be surrounded by the non-display area NDA entirely.

FIGS. 1A and 1B show an embodiment where the main display area MDA is arranged (or disposed) to surround at least a portion of a component area CA. In an alternative embodiment, the display apparatus 1 may have two or more auxiliary display areas ADA, and the shapes and sizes of the plurality of auxiliary display areas ADA may be different from one another. When viewed in a direction approximately perpendicular to the upper surface of the display apparatus 1 (e.g., a z direction), the shape of the auxiliary display area ADA may be various shapes such as circular shapes, elliptical shapes, polygons such as quadrangles, star shapes, diamond shapes, or the like. In an embodiment, as shown in FIGS. 1A and 1B that, when viewed in a direction approximately perpendicular to the upper surface of the display apparatus 1, the auxiliary display area ADA is arranged in the upper (a y direction) center of the main display area MDA having an approximately quadrangular shape, but not being limited thereto. Alternatively, the auxiliary display area ADA may be arranged on one side, for example, the upper right or the upper left of the main display area MDA that is a quadrangle.

The display apparatus 1 may display images by using a plurality of main sub-pixels Pm and a plurality of auxiliary sub-pixels Pa, where the plurality of main sub-pixels Pm may be arranged in the main display area MDA, and the plurality of auxiliary sub-pixels Pa may be arranged in the auxiliary display area ADA. The auxiliary display area ADA may include a component area CA and an intermediate area MA that at least partially surrounds the component area CA. Accordingly, the intermediate area MA may be arranged between the component area CA and the main display area MDA.

In an embodiment, the auxiliary display area ADA shown in FIGS. 1A and 1B may be implemented in various shapes. In an embodiment, one side of the auxiliary display area ADA may extend to contact the non-display area NDA as shown in FIG. 1A. Alternatively, the auxiliary display area ADA may be arranged inside the main display area MDA as shown in FIG. 1B. As described below with reference to FIG. 2A, a component 40 (see FIG. 2A), which is an electronic element, may be arranged below a display panel to correspond to the component area CA. The component area CA may include a transmission area TA through which light and/or sound that is output from the component 40 to the outside or that progresses toward the component 40 from the outside may pass.

A plurality of auxiliary pixels Pa may be arranged in the auxiliary display area ADA. The auxiliary sub-pixel Pa may include a first auxiliary sub-pixel Pa1 and a second auxiliary sub-pixel Pa2, where the first auxiliary sub-pixel Pa1 may be arranged in the component area CA, and the second auxiliary sub-pixel Pa2 may be arranged in the intermediate area MA.

The plurality of auxiliary sub-pixels Pa may display a preset image by emitting light. An image displayed in the auxiliary display area ADA is an auxiliary image, and the resolution of the auxiliary image may be equal to or less than the resolution of an image displayed in the main display area MDA. In an embodiment, because the component area CA includes the transmission area TA, the resolution of the component area CA may be less than the resolution of the main display area MDA. In an embodiment, for example, the resolution of the component area CA may be about ½, ⅜, ⅓, ¼, ⅖, ⅛, ⅑, 1/16, or the like of the resolution of the main display area MDA. In an embodiment, for example, the resolution of the main display area MDA may be about 400 pixels per inch (ppi) or more, and the resolution of the component area CA may be about 200 ppi or about 100 ppi. In an embodiment, the resolution of the component area CA may be about 400 ppi.

In an embodiment, where the component area CA inside the auxiliary display area ADA includes the transmission area TA through which light and/or sound may pass, sub-pixels may not be arranged in the transmission area TA, such that the number of first auxiliary sub-pixels Pa1 per unit area in the component area CA may be less than the number of main sub-pixels Pm per unit area in the main area MDA.

Figure 2A:
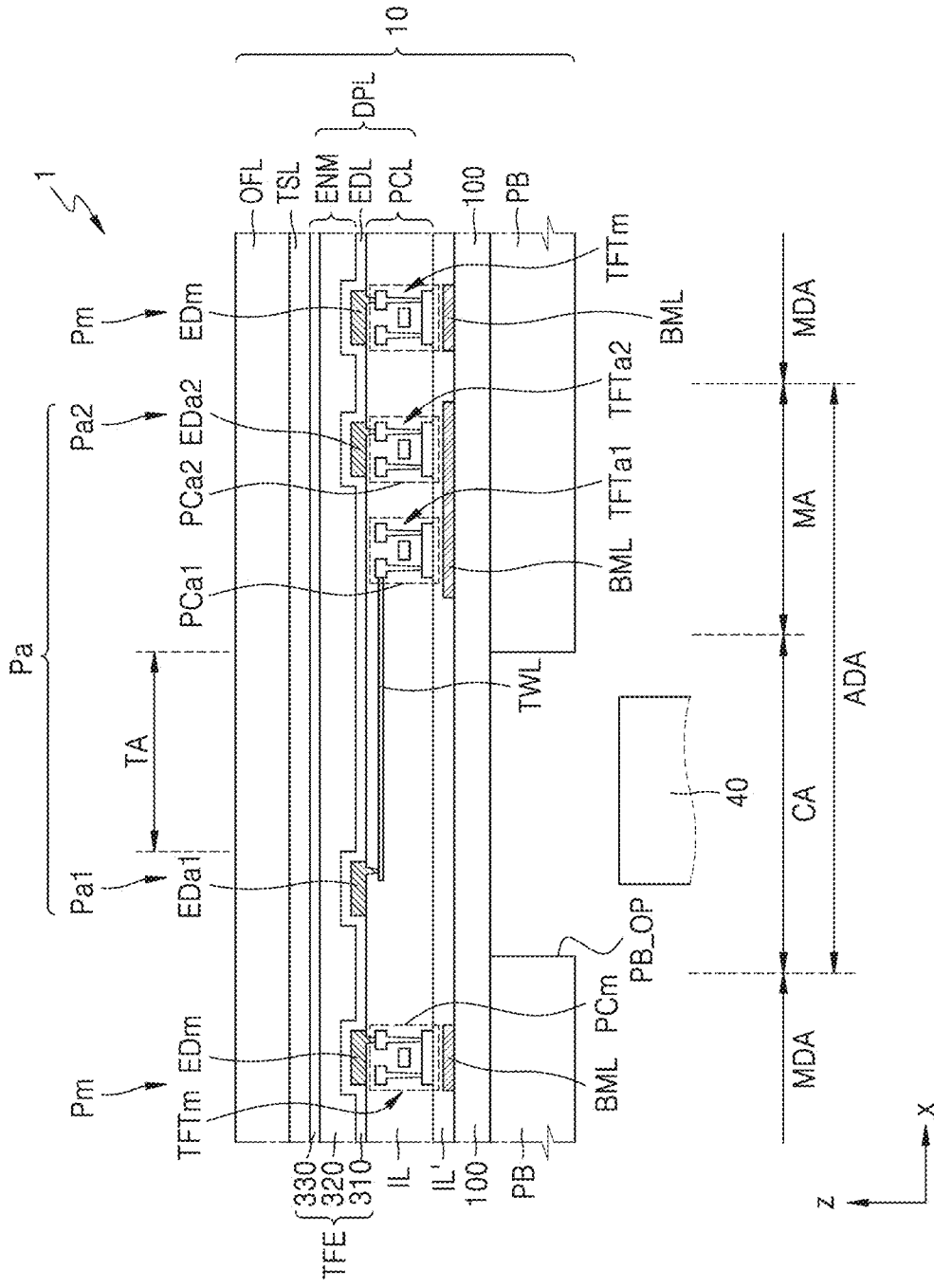
FIGS. 2A and 2B are schematic cross-sectional views of a display apparatus according to an embodiment.
Figure 2B:
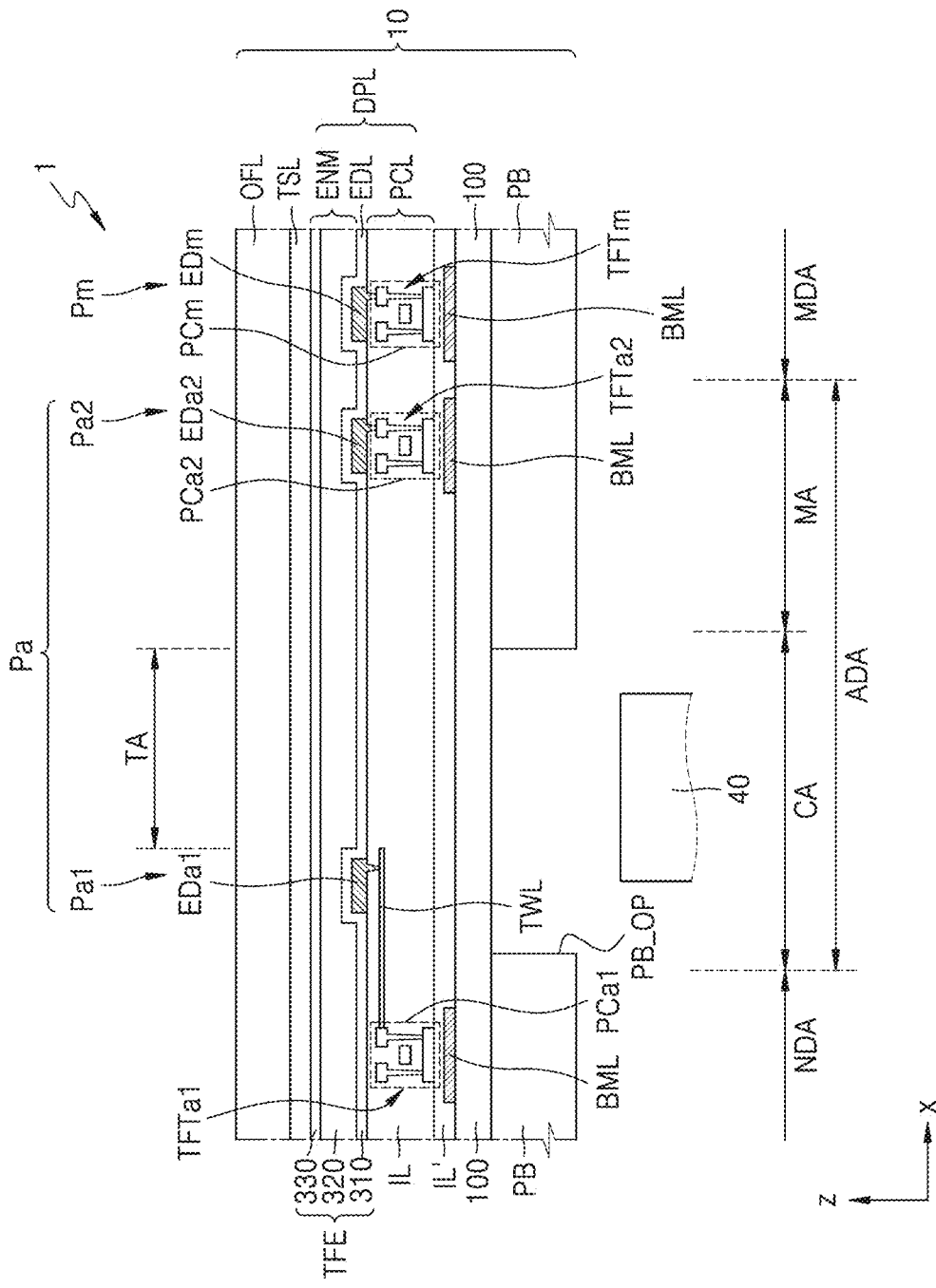

FIGS. 2A and 2B are schematic cross-sectional views of the display apparatus 1 according to an embodiment.

Referring to FIGS. 2A and 2B, an embodiment of the display apparatus 1 may include a display panel 10 and the component 40 overlapping the display panel 10. A cover window (not shown) for protecting the display panel 10 may be arranged on the display panel 10.

The component 40 may be an electronic element that uses light or sound. In an embodiment, for example, the electronic element may be a sensor that measures a distance such as a proximity sensor, a sensor that recognizes a portion of a user's body (e.g., a fingerprint, an iris, a face and the like), a small lamp that outputs light, or an image sensor (e.g., a camera) that captures images. The electronic element that uses light may use light in various wavelength bands such as visible light, infrared light, ultraviolet light or the like. The electronic element that uses sound may use ultrasonic waves or sound in different frequency bands. In an embodiment, the component 40 may include sub-components such as a light-emitter and a light-receiver. The light-emitter and the light-receiver may have a structure integrated in a single body or unit (e.g., a module), or a pair of the light-emitter and the light-receiver that are physically separated may constitute or collectively define the component 40.

In an embodiment where light is allowed to pass through the component area CA, a light transmittance may be about 10% or more, e.g., about 40% or more, about 25% or more, about 50% or more, about 85% or more, or about 90% or more.

The display panel 10 may include the auxiliary display area ADA and the main display area MDA, where auxiliary images may be displayed in the auxiliary display area ADA, and main images may be displayed in the main display area MDA. The auxiliary display area ADA may include the component area CA and the intermediate area MA, where the component area CA may overlap the component 40, and the intermediate area MA may surround the component area CA.

The display panel 10 may include a substrate 100, a display layer DPL, a touchscreen layer TSL, an optical functional layer OFL, and a panel protection member PB, where the display layer DPL, the touchscreen layer TSL and the optical functional layer OFL may be on the substrate 100, and the panel protection member PB may be under the substrate 100.

The display layer DPL may include a display circuit layer PCL, a display element layer EDL, and an encapsulation member ENM, where the display circuit layer PCL may include thin-film transistors TFTm, TFTa1, and TFTa2, the display element layer EDL may include display elements EDm, EDa1, and EDa2 which are light-emitting elements, and the encapsulation member ENM may include a thin-film encapsulation layer TFE or an encapsulation substrate (not shown). Insulating layers IL and IL' may be disposed between the substrate 100 and the display layer DPL, and inside the display layer DPL. In an embodiment, for example, the display elements EDm, EDa1, and EDa2 may include a light-emitting diode. In an embodiment, as shown in FIGS. 2A and 2B that the display elements EDm, EDa1, and EDa2 may be organic light-emitting diodes. Hereinafter, though embodiments where a light-emitting diode includes an organic light-emitting diode will be described in detail, but the embodiment is not limited thereto. In an alternative embodiment, a display element may be a light-emitting diode including an inorganic material, or a quantum-dot light-emitting diode including quantum dots. In an embodiment, for example, an emission layer of the display element may include an organic material, an inorganic material, quantum dots, an organic material and quantum dots, or an inorganic material and quantum dots.

The substrate 100 may include an insulating material such as glass, quartz, a polymer resin or the like. The substrate 100 may be a rigid substrate or a flexible substrate that is bendable, foldable, and/or rollable.

A main display element EDm and a main sub-pixel circuit PCm connected thereto may be arranged in the main display area MDA of the display panel 10. The main sub-pixel circuit PCm may include at least one thin-film transistor TFTm and control an operation of the main display element EDm. The main sub-pixels Pm may be implemented by light-emitting of the main display element EDm.

A first auxiliary display element EDa1 may be arranged in the component area CA of the display panel 10 to implement the first auxiliary sub-pixel Pa1. In an embodiment, as shown in FIG. 2A, a first auxiliary sub-pixel circuit PCa1 that drives the first auxiliary display element EDa1 may not be arranged in the component area CA, but may be arranged in the intermediate area MA between the main display area MDA and the component area CA. In an alternative embodiment, as shown in FIG. 2B, the first auxiliary sub-pixel circuit PCa1 that drives the first auxiliary display element EDa1 may not be arranged in the component area CA but may be arranged in the non-display area NDA. In such an embodiment, the first auxiliary sub-pixel circuit PCa1 may not overlap the first auxiliary display element EDa1.

The first auxiliary sub-pixel circuit PCa1 may include a first auxiliary thin-film transistor TFTa1 and be electrically connected to the first auxiliary light-emitting element EDa1 by a connection line TWL. The first auxiliary sub-pixel circuit PCa1 may control the operation of the first auxiliary display element EDa1. The first auxiliary sub-pixel Pa1 may be implemented by light-emitting of the first auxiliary display element EDa1.

A region of the component area CA in which the first auxiliary display element EDa1 is not arranged may be defined as the transmission area TA. The transmission area TA may be a region through which light/signal emitted from the component 40 or light/signal incident to the component 40 passes, and the component 40 may be arranged to correspond to the component area CA.

The connection line TWL connecting the first auxiliary sub-pixel circuit PCa1 to the first auxiliary display element EDa1 may be arranged in the transmission area TA. In an embodiment, the auxiliary sub-pixel circuit PCa is not arranged in the component area CA, such that the area of the transmission area TA may be extended and a light transmittance may be improved even more.

The second auxiliary display element EDa2 and the second auxiliary sub-pixel circuit PCa2 connected thereto may be arranged in the intermediate area MA of the display panel 10 to implement the second auxiliary sub-pixel Pa2. The first auxiliary sub-pixel circuit PCa1 and the second auxiliary sub-pixel circuit PCa2 in the intermediate area MA may be adjacent to each other and alternately arranged with each other.

In an embodiment, as shown in FIGS. 2A and 2B, the display element layer EDL may be covered by the thin-film encapsulation layer TFE or the encapsulation substrate. In an embodiment, the thin-film encapsulation layer TFE may include at least one inorganic encapsulation layer and at least one organic encapsulation layer. In an embodiment, for example, the thin-film encapsulation layer TFE may include a first inorganic encapsulation layer 310, a second inorganic encapsulation layer 330, and an organic encapsulation layer 320.

The first inorganic encapsulation layer 310 and the second inorganic encapsulation layer 330 may each include at least one inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$), and be formed by a chemical vapor deposition ("CVD"). The organic encapsulation layer 320 may include a polymer-based material. The polymer-based material may include at least one selected from an acryl-based resin (e.g., polymethylmethacrylate, poly acrylic acid, and the like), an epoxy-based resin, polyimide, and polyethylene.

The first inorganic encapsulation layer 310, the organic encapsulation layer 320, and the second inorganic encapsulation layer 330 may each be formed as a single unitary body to cover the main display area MDA and the auxiliary display area ADA.

The touchscreen layer TSL may obtain coordinate information corresponding to an external input, for example, a touch event. The touchscreen layer TSL may include a touch electrode and touch wirings connected to the touch electrode. The touchscreen layer TSL may sense an external input by using a self-capacitance method or a mutual capacitance method.

In an embodiment, the touchscreen layer TSL may be disposed on the thin-film encapsulation layer TFE. Alternatively, the touchscreen layer TSL may be separately formed on a touch substrate and then coupled on the thin-film encapsulation layer TFE through an adhesive layer such as an optically clear adhesive ("OCA"). In an embodiment, the touchscreen layer TSL may be formed directly on the thin-film encapsulation layer TFE. In such an embodiment, an adhesive layer may not be disposed between the touchscreen layer TSL and the thin-film encapsulation layer TFE.

The optical functional layer OFL may include an anti-reflection layer. The anti-reflection layer may reduce reflectivity of light (external light) incident toward the display apparatus 1 from outside. In an embodiment, the optical functional layer OFL may be a polarizing film. In an alternative embodiment, the optical functional layer OFL may include an opening (not shown) corresponding to the transmission area TA. Accordingly, a light transmittance of the transmission area TA may be substantially improved. A transparent material such as an optically clear resin ("OCR") may fill the opening. In an alternative embodiment, the optical functional layer OFL may be a filter plate including a black matrix and color filters.

The panel protection member PB may be attached under the substrate 100 to support and protect the substrate 100. In an embodiment, an opening PB_OP corresponding to the component area CA may be defined in the panel protection member PB. In such an embodiment where the opening PB_OP is defined in the panel protection member PB, a light transmittance of the component area CA may be improved. The panel protection member PB may include polyethylene terephthalate or polyimide. The area of the component area CA may be greater than an area in which the component 40 is arranged. Accordingly, the area of the opening PB_OP of the panel protection member PB may not coincide with the area of the component area CA. in an embodiment, as shown in FIGS. 2A and 2B, the component 40 is apart on one side of the display panel 10. Alternatively, at least a portion of the component 40 may be inserted to the opening PB_OP of the panel protection member PB.

One or a plurality of components 40 may be arranged in the component area CA. The plurality of components 40 may have different functions from each other. In an embodiment, for example, the components 40 may include at least one selected from a camera (a photographing element), a speaker, a solar battery, a flash, a light-sensing sensor, a heat-sensing sensor, a proximity sensor, an illuminance sensor, and an iris sensor.

In an embodiment, as shown in FIGS. 2A and 2B, a bottom metal layer BML may be arranged below the first auxiliary sub-pixel circuit PCa1 and/or the second auxiliary sub-pixel circuit PCa2 in the intermediate area MA. The bottom metal layer BML may overlap the sub-pixel circuits to protect the sub-pixel circuits. In an embodiment, the bottom metal lay BML may overlap the first auxiliary sub-pixel circuit PCa1 and/or the second auxiliary sub-pixel circuit PCa2 between the substrate 100 and the first auxiliary sub-pixel circuit PCa1 and/or the second auxiliary sub-pixel circuit PCa2. The bottom metal layer BML may block external light such that the external light is prevented from reaching the first auxiliary sub-pixel circuit PCa1 and/or the second auxiliary sub-pixel circuit PCa2. In an embodiment, the bottom metal layer BML may be disposed also below the main sub-pixel circuit PCm of the main display area MDA. The bottom metal layer BML disposed below the main sub-pixel circuit PCm may be apart from the bottom metal layer BML disposed below the first auxiliary sub-pixel circuit PCa1 and/or the second auxiliary sub-pixel circuit PCa2. In an alternative embodiment, the bottom metal layer BML may be provided to correspond to the display area DA entirely and may include a bottom-hole corresponding to the component area CA. In an alternative embodiment, the bottom metal layer BML may be omitted.

Embodiments of the display apparatus described with reference to FIGS. 1A and 2B may be portable electronic apparatuses such as mobile phones, smart phones, tablet personal computers, mobile communication terminals, electronic organizers, electronic books, portable multimedia players ("PMP"), navigations, and ultra mobile personal computers ("UMPC"), or the like. In embodiments, the display apparatus 1 may be included in wearable electronic apparatuses including smartwatches, watchphones, glasses-type displays, and head-mounted displays ("HMD"). In an embodiment, the display apparatus 1 may be used as instrument panels for automobiles, center fascias for automobiles, or center information displays ("CID") arranged on a dashboard, room mirror displays that replace side mirrors of automobiles, and displays arranged on the backside of front seats as an entertainment for back seats of automobiles.

Figure 3A:
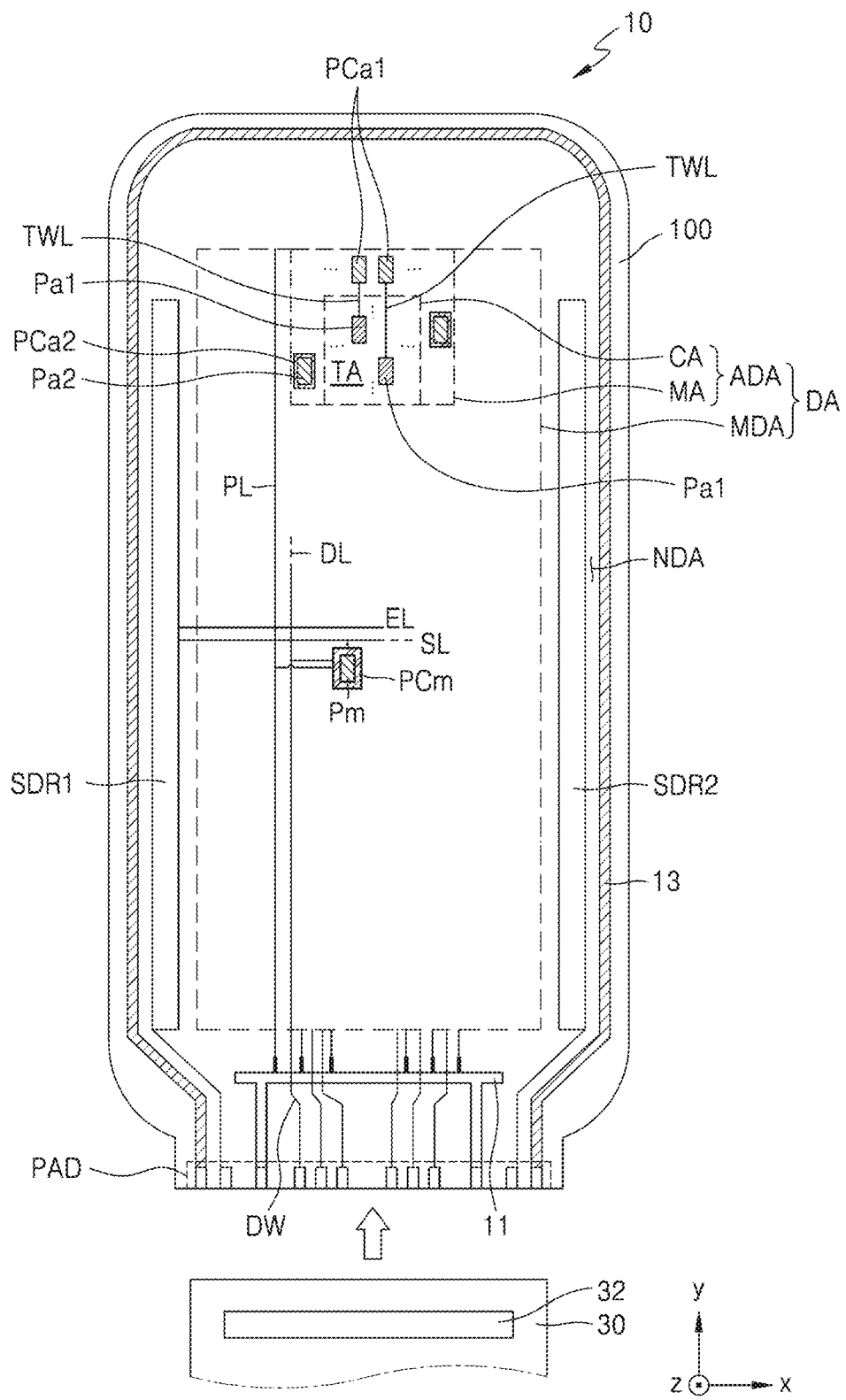
FIGS. 3A and 3B are schematic plan views of a display panel that may be included in a display apparatus according to an embodiment.
Figure 3B:
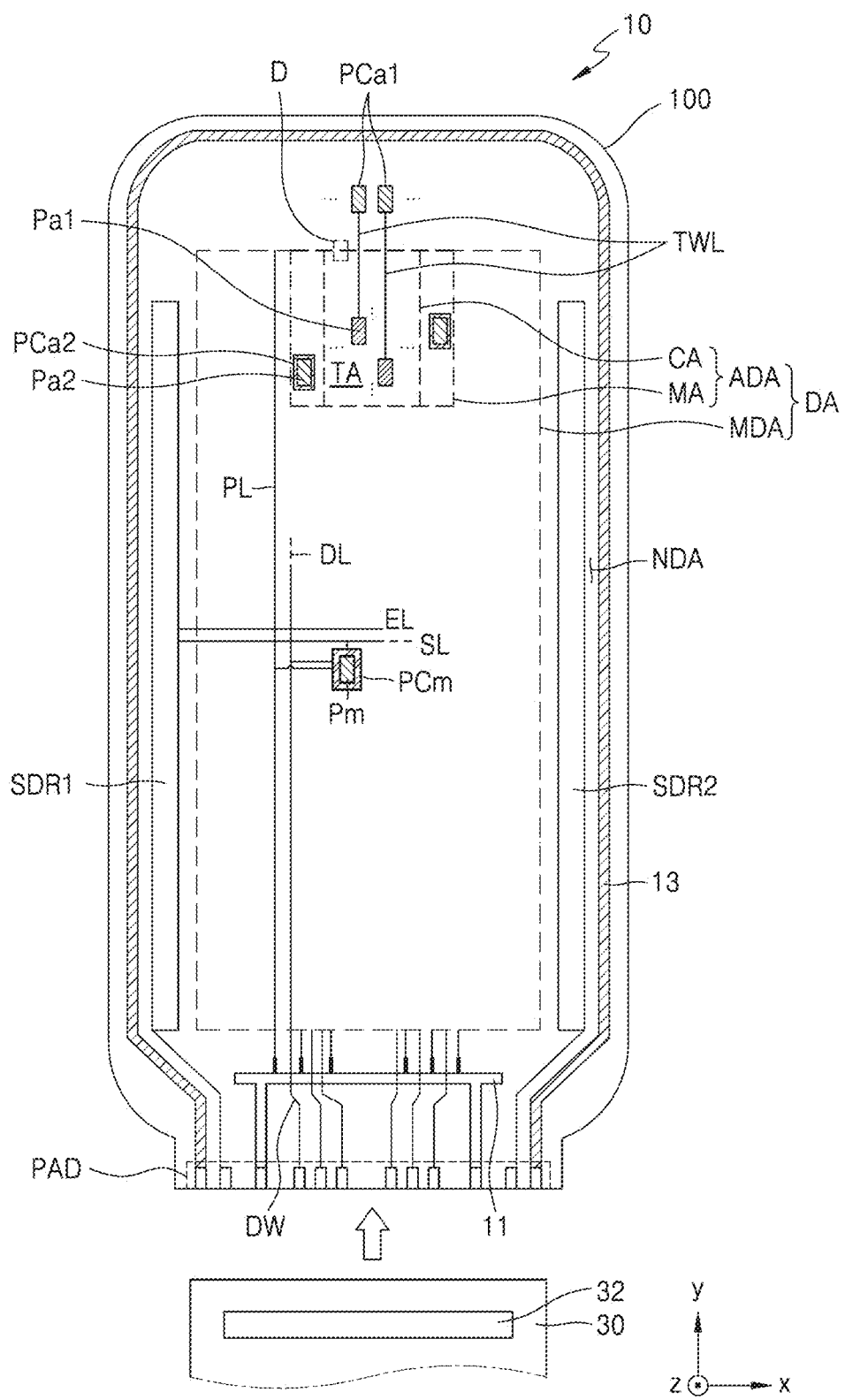

FIGS. 3A and 3B are schematic plan views of the display panel 10 provided to the display apparatus 1 according to an embodiment.

Referring to FIGS. 3A and 3B, various kinds of elements constituting the display panel 10 are arranged over the substrate 100.

In an embodiment, a plurality of main sub-pixels Pm is arranged in the main display area MDA. The plurality of main sub-pixels Pm may each be implemented as a light-emitting element by a display element such as an organic light-emitting diode OLED. The main sub-pixel circuit PCm that drives the main sub-pixel Pm may be arranged in the main display area MDA, and may overlap the main sub-pixel Pm. Each main sub-pixel Pm may emit, for example, red, green, blue, or white light. The main display area MDA may be protected from external air, moisture, or the like by being covered by the encapsulation member.

In an embodiment, as described above, the auxiliary display area ADA may be arranged on one side of the main display area MDA, or arranged inside the display area DA and thus surrounded by the main display area MDA. The plurality of auxiliary sub-pixels, that is, the first auxiliary sub-pixel Pa1 and the second auxiliary sub-pixel Pa2 may be arranged in the auxiliary display area ADA. The first auxiliary sub-pixel Pa1 and the second auxiliary sub-pixel Pa2 may each be implemented as a light-emitting element by a display element such as an organic light-emitting diode. Each auxiliary sub-pixel Pa may emit, for example, red, green, blue, or white light. The auxiliary display area ADA may be protected from external air, moisture, or the like by being covered by the encapsulation member.

The auxiliary display area ADA may include the component area CA and the intermediate area MA that at least partially surrounds the component area CA. The first auxiliary sub-pixel Pa1 may be implemented in the component area CA, and the second auxiliary sub-pixel Pa2 may be implemented in the intermediate area MA. In such an embodiment, the first auxiliary sub-pixel Pa1 substantially emits light in the component area CA, and the second auxiliary sub-pixel Pa2 substantially emits light in the intermediate area MA.

Referring to FIG. 3A, in an embodiment, the first auxiliary display element EDa1 (see FIG. 2A) that implements the first auxiliary sub-pixel Pa1 is arranged in the component area CA, the first auxiliary sub-pixel circuit PCa1 is arranged in the intermediate area MA, and the first auxiliary display element EDa1 (see FIG. 2A) may be connected to the first auxiliary sub-pixel circuit PCa1 by the connection line TWL.

Referring to FIG. 3B, in an alternative embodiment, the first auxiliary display element EDa1 (see FIG. 2B) that implements the first auxiliary sub-pixel Pa1 is arranged in the component area CA, the first auxiliary sub-pixel circuit PCa1 is arranged in the non-display area NDA, and the first auxiliary display element EDa1 (see FIG. 2B) may be connected to the first auxiliary sub-pixel circuit PCa1 by the connection line TWL.

Referring to FIGS. 3A and 3B, in an embodiment, the first auxiliary display element EDa1 is arranged in the component area CA, but the first auxiliary sub-pixel circuit PCa1 electrically connected to the first auxiliary display element EDa1 is not arranged in the component area CA. In a case where the first auxiliary sub-pixel circuit PCa1 including transistors and a storage capacitor connected to various kinds of signal lines and voltage lines is arranged in the component area CA, it may be difficult to sufficiently secure the area of the transmission area TA due to the presence of the auxiliary sub-pixel circuit PCa1. In an embodiment, the auxiliary sub-pixel circuit PCa1 is arranged in the intermediate area MA or the non-display area NDA, and the first auxiliary display element EDa1 is arranged in the component area CA, such that the resolution of the component area CA may be maintained and the area of the transmission area TA may be increased.

The pixel circuits PCm, PCa1, and PCa2 that drive the pixels Pm, Pa1, and Pa2 in the display area DA may each be electrically connected to outer circuits arranged in the non-display area NDA. A first scan driving circuit SDR1, a second scan driving circuit SDR2, a terminal part PAD, a driving voltage supply line 11, and a common voltage supply line 13 may be arranged in the non-display area NDA.

The first scan driving circuit SDR1 may apply scan signals to the main sub-pixel circuit PCm that drives the main sub-pixel Pm through a scan line SL. In addition, the first scan driving circuit SDR1 may apply an emission control signal to each pixel circuit through an emission control line EL. The second scan driving circuit SDR2 may be arranged symmetrical with the first scan driving circuit SDR1 around the main display area MDA. A portion of the main sub-pixel circuit PCm of the main sub-pixel Pm in the main display area MDA may be electrically connected to the first scan driving circuit SDR1, and the rest may be electrically connected to the second scan driving circuit SDR2.

The terminal part PAD may be arranged on one side of the substrate 100. The terminal part PAD may be exposed and connected to a display circuit board 30 by not being covered by an insulating layer. A display driver 32 may be arranged on the display circuit board 30.

The display driver 32 may be configured to generate control signals transferred to the first scan driving circuit SDR1 and the second scan driving circuit SDR2. The display driver 32 may be configured to generate a data signal, and the generated data signal may be transferred to the main sub-pixel circuit PCm through a first fan-out wiring DW and a data line DL connected to the first fan-out wiring DW.

The display driver 32 may be configured to supply a driving voltage ELVDD to the driving voltage supply line 11 and supply a common voltage ELVSS to the common voltage supply line 13. The driving voltage ELVDD may be applied to the pixel circuits of the sub-pixels Pm and Pa through a driving voltage line PL connected to the driving voltage supply line 11, and the common voltage ELVSS may be applied to an opposite electrode of the display element through the common voltage supply line 13.

The driving voltage supply line 11 may extend in the x direction below the main display area MDA. The common voltage supply line 13 may have a loop shape having one open side to partially surround the main display area MDA.

Figure 4:
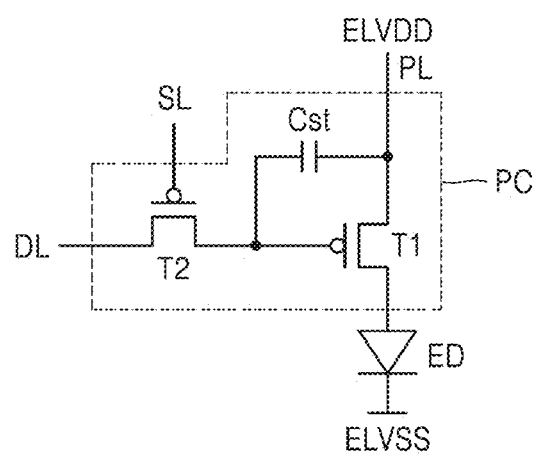
FIG. 4 is a schematic equivalent circuit diagram of a display element of a display apparatus and a pixel circuit electrically connected thereto, according to an embodiment.

FIG. 4 is a schematic equivalent circuit diagram of the display element of the display apparatus and the sub-pixel circuit PC electrically connected thereto according to an embodiment.

The sub-pixel circuit PC shown in FIG. 4 may correspond to each of the main sub-pixel circuit PCm, the first auxiliary sub-pixel circuit PCa1, and the second auxiliary sub-pixel circuit PCa2 described above with reference to FIGS. 3A and 3B.

An embodiment of a display element ED shown in FIG. 4 may correspond to each of the main display element EDm, the first auxiliary display element EDa1, and the second auxiliary display element EDa2 described above with reference to FIGS. 3A and 3B. In an embodiment, the display element ED may be an organic light-emitting diode.

Referring to FIG. 4, an embodiment of the sub-pixel circuit PC may include a driving thin-film transistor T1, a switching thin-film transistor T2, and a storage capacitor Cst.

The switching thin-film transistor T2 is electrically connected to a scan line SL and a data line DL, and configured to transfer a data voltage or a data signal to the driving thin-film transistor T1 based on a switching voltage or a switching signal input from the scan line SL, where the data voltage or the data signal may be input from the data line DL. The storage capacitor Cst may be electrically connected to the switching thin-film transistor T2 and the driving voltage line PL and configured to store a voltage corresponding to a difference between a voltage transferred from the switching thin-film transistor T2 and a driving voltage ELVDD supplied to the driving voltage line PL.

The driving thin-film transistor T1 may be electrically connected to the driving voltage line PL and the storage capacitor Cst and configured to control a driving current based on the voltage stored in the storage capacitor Cst, where the driving current may flow from the driving voltage line PL to the display element ED. The display element ED may emit light having a preset brightness based on the driving current. The opposite electrode of the display element ED may receive the common voltage ELVSS.

In an embodiment, as shown in FIG. 4, the sub-pixel circuit PC includes two thin-film transistors and a single storage capacitor, but not being limited thereto. Alternatively, the sub-pixel circuit PC may include three or more thin-film transistors.

Figure 5:
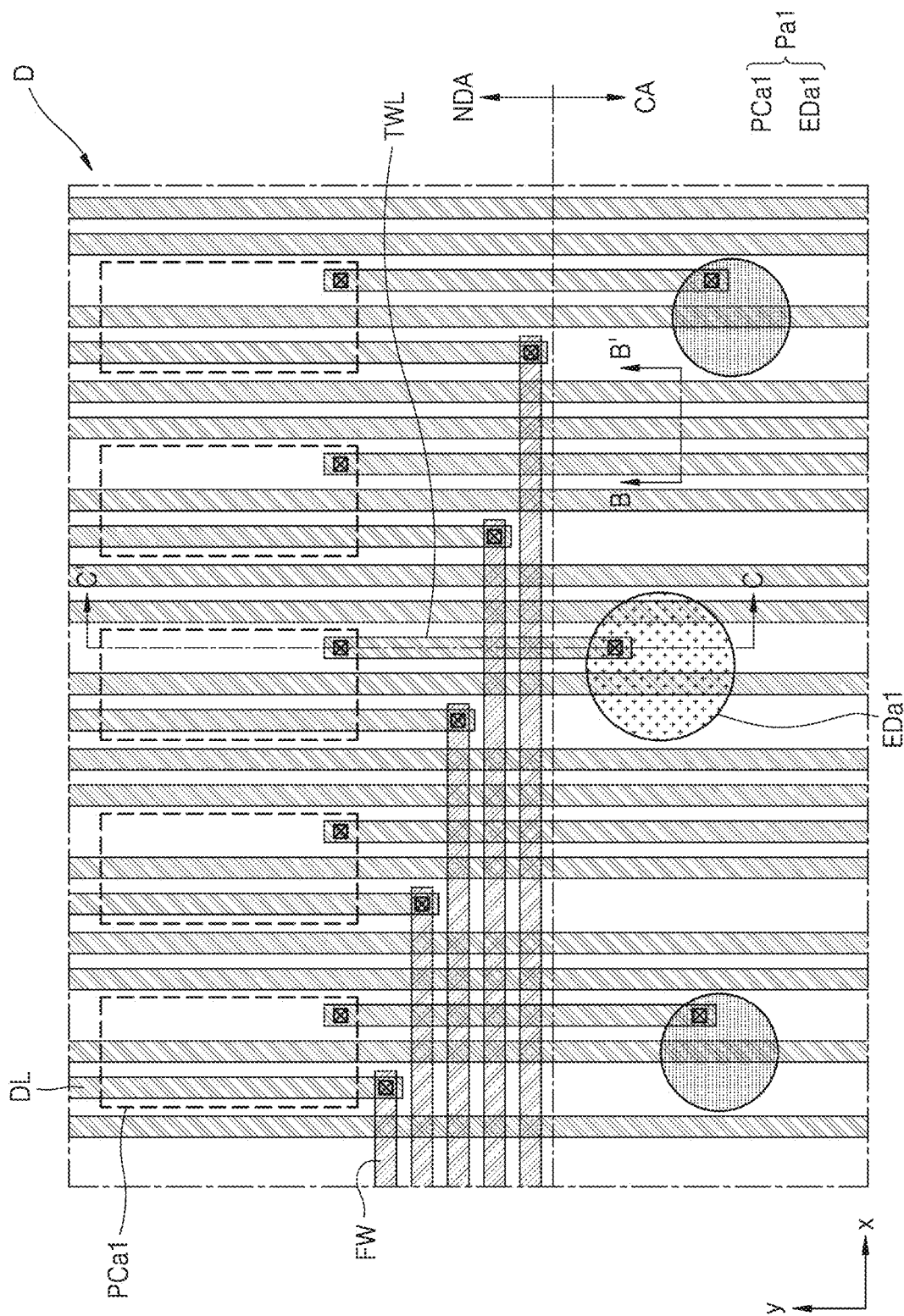
FIG. 5 is a plan view of a portion of the display apparatus according to an embodiment, showing a region D of FIG. 3B.

FIG. 5 is a schematic plan view of a portion of the display apparatus according to an embodiment, and corresponds to a region D of FIG. 3B. FIG. 5 shows in more detail a portion of the component area CA and the non-display area NDA adjacent to the component area CA.

Referring to FIGS. 3B and 5, the first auxiliary display element EDa1 of the first auxiliary sub-pixel Pa1 may be arranged in the component area CA. The first auxiliary display element EDa1 may be an organic light-emitting diode and may emit red, green, blue, or white light. The first auxiliary sub-pixel circuit PCa1 configured to drive the first auxiliary display element EDa1 may be arranged in the non-display area NDA. The first auxiliary display element EDa1 of the first auxiliary sub-pixel Pa1 may be connected to the first auxiliary sub-pixel circuit PCa1 by the connection line TWL passing or extending across the component area CA and the non-display area NDA.

The data line DL configured to provide a data signal to the first auxiliary sub-pixel circuit PCa1 in the non-display area NDA may be electrically connected to the data line DL arranged in the main display area MDA (see FIG. 3B). In an embodiment, for example, the data line DL in the non-display area NDA may be electrically connected to the data line DL in the main display area MDA (see FIG. 3B) by a fan-out wiring FW. The fan-out wiring FW may extend to pass across the non-display area NDA, the intermediate area MA, and the main display area MDA (see FIGS. 3B and 5).

Like the data line DL, other wirings except the connection line TWL, for example, the driving voltage line, the scan line, and the like are not arranged in the component area CA. Accordingly, an area through which light may pass may be sufficiently secured in the component area CA.

The connection line TWL may extend in a direction, for example, a −y direction parallel to the data line DL. The connection line TWL connects the display element to the sub-pixel circuit arranged in different regions, respectively. The connection line TWL may electrically connect the first auxiliary display elements Eda1 in the component area CA to the first auxiliary sub-pixel circuits PCa1 arranged in the non-display area NDA. Accordingly, the connection line TWL may extend to pass across the non-display area NDA and the component area CA. The connection lines TWL may be arranged parallel to each other in a plan view.

Figure 6:
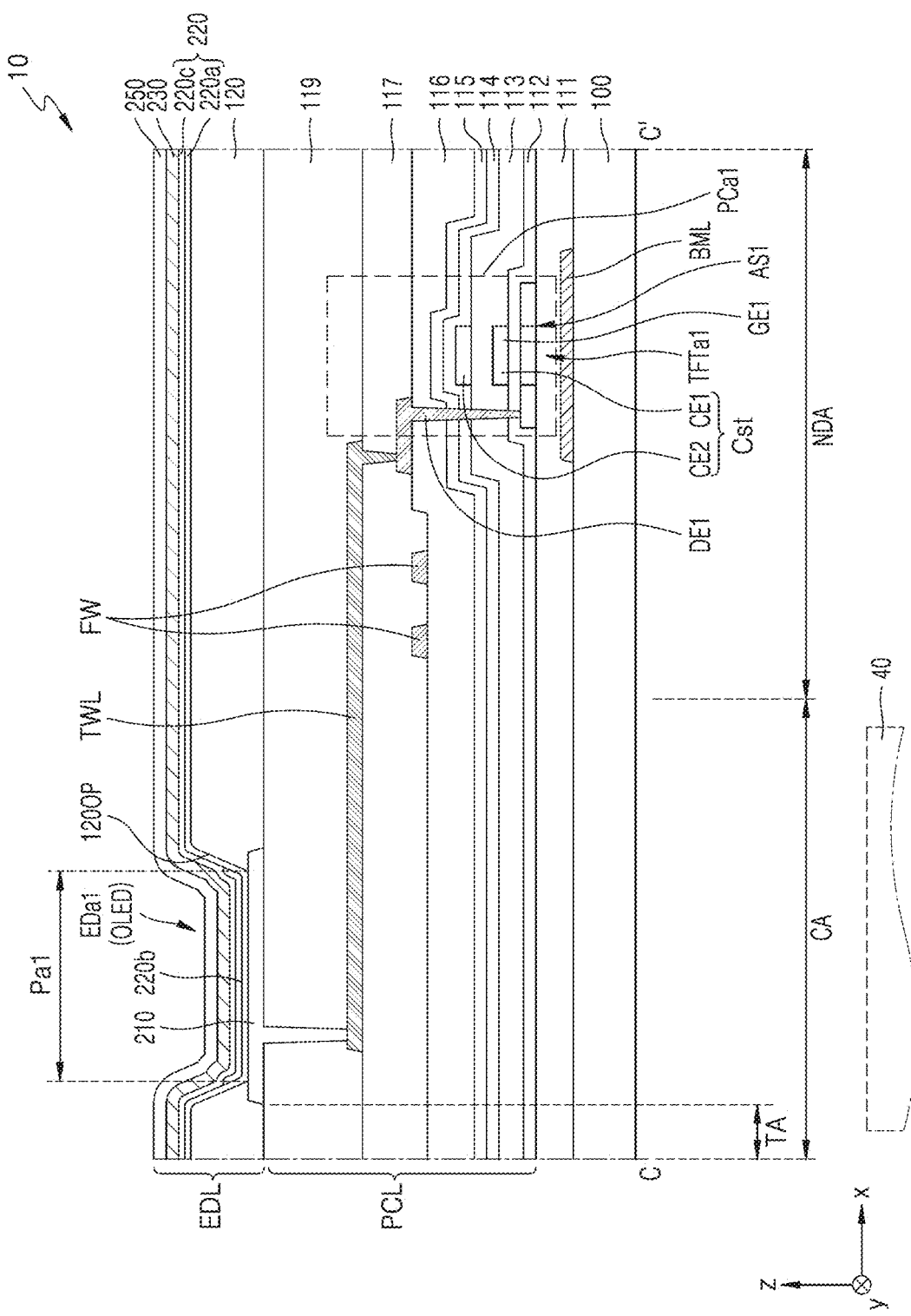
FIG. 6 is a cross-sectional view of a portion of the display apparatus, taken along a line C-C' of FIG. 5.

FIG. 6 is a cross-sectional view of a portion of the display apparatus, taken along line C-C' of FIG. 5.

Referring to FIGS. 5 and 6, in an embodiment of a display panel 10, the first auxiliary sub-pixel circuit PCa1 may include a plurality of thin-film transistors. For convenience of illustration, FIG. 6 shows only a first auxiliary thin-film transistor TFTa1 of the first auxiliary sub-pixel circuit PCa1 among the plurality of thin-film transistors.

The organic light-emitting diode OLED corresponding to the first auxiliary display element EDa1 of the first auxiliary display element Pa1 may be connected to the first auxiliary sub-pixel circuit PCa1 through the connection line TWL. One side of the connection line TWL may be connected to the auxiliary sub-pixel circuit PCa1, and another side may be connected to a first electrode 210 of the organic light-emitting diode OLED which is the display element.

In an embodiment, as shown in FIG. 6, the connection line TWL may be disposed on a first organic insulating layer 117 and directly connected to the first auxiliary sub-pixel circuit PCa1. In an alternative embodiment, the connection line TWL may be connected to the first auxiliary pixel circuit PCa1 through a separate conductive line disposed in a different layer.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, or the like. In an embodiment, the substrate 100 may have a multi-layered structure including a base layer and a barrier layer (not shown) each including the polymer resin. The substrate 100 including the polymer resin is flexible, rollable, and/or bendable.

The pixel circuit layer PCL may be disposed on the substrate 100. The pixel circuit layer PCL may include the first auxiliary sub-pixel circuit PCa1 and insulating layers. In an embodiment, the insulating layers are inorganic insulating layers and may include a buffer layer 111, a first gate insulating layer 112, a second gate insulating layer 113, a first interlayer insulating layer 114, a second interlayer insulating layer 115, and a third interlayer insulating layer 116. In an embodiment, the insulating layers are organic insulating layers and may include a first organic insulating layer 117 and a second organic insulating layer 119.

The first auxiliary sub-pixel circuit PCa1 may include the first auxiliary thin-film transistor TFTa1 and the storage capacitor Cst. The first auxiliary thin-film transistor TFTa1 may include a first semiconductor layer AS1, a first gate electrode GE1, a first source electrode SE1, and a first drain electrode DE1. The storage capacitor Cst may include a lower electrode CE1 and an upper electrode CE2. The first auxiliary thin-film transistor TFTa1 may serve as a driving thin-film transistor.

The buffer layer 111 may be disposed on the substrate 100. The buffer layer 111 may include an inorganic insulating material such as silicon nitride ($SiN_x$), silicon oxynitride (SiON), or silicon oxide ($SiO_x$), and have a single-layered structure or a multi-layered structure, each layer therein including at least one selected from the inorganic insulating materials listed above.

The bottom metal layer BML may be disposed between the substrate 100 and the buffer layer 111. The bottom metal layer BML may overlap the first auxiliary sub-pixel circuit PCa1 below the first auxiliary sub-pixel circuit PCa1 to protect the first auxiliary sub-pixel circuit PCa1. The bottom metal layer BML may include a reflective metal, for example, silver (Ag), molybdenum (Mo), aluminum (Al), aluminum nitride (AlN), tungsten (W), tungsten nitride (WN), copper (Cu), titanium (Ti), silicon (Si) or the like.

The first semiconductor layer AS1 may include a silicon semiconductor. In an embodiment, the first semiconductor layer AS1 may include polycrystalline silicon. Alternatively, the first semiconductor layer AS1 may include amorphous silicon. In an embodiment, the first semiconductor layer AS1 may include an oxide semiconductor, an organic semiconductor or the like. The first semiconductor layer AS1 may include a channel region, a drain region, and a source region, where the drain region and the source region are on two opposite sides of the channel region. The first gate electrode GE1 may overlap the channel region.

The first gate electrode GE1 may overlap the first semiconductor layer AS1. The first gate electrode GE1 may include a low-resistance metal material. The first gate electrode GE1 may include a conductive material including at least one selected from molybdenum (Mo), aluminum (Al), copper (Cu), and titanium (Ti) and have a single-layered structure or a multi-layered structure, each layer therein including at least one selected from the above materials.

The first gate insulating layer 112 may be arranged between the first semiconductor layer AS1 and the first gate electrode GE1. Accordingly, the first semiconductor layer AS1 may be insulated from the first gate electrode GE1. The first gate insulating layer 112 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The second gate insulating layer 113 may cover the first gate electrode GE1. The second gate insulating layer 113 may be disposed on the first gate electrode GE1. The second gate insulating layer 113 may include an inorganic insulating material including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

The upper electrode CE2 may be disposed on the second gate insulating layer 113. In an embodiment, the upper gate electrode CE2 may overlap the first gate electrode GE1 therebelow. In such an embodiment, the upper electrode CE2 may overlap the first gate electrode GE1 with the second gate insulating layer 113 therebetween to constitute the storage capacitor Cst. In such an embodiment, the first gate electrode GE1 of the first auxiliary thin-film transistor TFTa1 may serve as the lower electrode CE1 of the storage capacitor Cst.

In an embodiment, as described above, the storage capacitor Cst may overlap the first auxiliary thin-film transistor TFTa1. In an alternative embodiment, the storage capacitor Cst may not overlap the first auxiliary thin-film transistor TFTa1.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and have a single-layered structure or a multi-layered structure, each layer therein including at least one selected from the above materials.

The first interlayer insulating layer 114 and the second interlayer insulating layer 115 may cover the upper electrode CE2. In an embodiment, the first interlayer insulating layer 114 and the second interlayer insulating layer 115 may cover the first gate electrode GE1. The first interlayer insulating layer 114 and the second interlayer insulating layer 115 may each include an inorganic insulating material including silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The first interlayer insulating layer 114 and the second interlayer insulating layer 115 may each have a single-layered structure or a multi-layered structure, each layer therein including at least one selected from the above inorganic insulating materials.

The first source electrode (not shown) and the first drain electrode DE1 may be disposed on the third interlayer insulating layer 116. The first source electrode (not shown) and the first drain electrode DE1 may be connected to the first semiconductor layer AS1. The first source electrode and the first drain electrode DE1 may be connected to the first semiconductor layer AS1 through contact holes defined in the insulating layers.

The first source electrode and the first drain electrode DE1 may include a conductive material at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu), and have a single-layered structure or a multi-layered structure, each layer therein including at least one selected from the above materials. In an embodiment, the first source electrode (not shown) and the first drain electrode DE1 may each have a multi-layered structure of Ti/Al/Ti.

In an embodiment, a second fan-out wiring FW connected to the data line DL (see FIG. 5) may be disposed on the third interlayer insulating layer 116. However, the embodiment is not limited thereto. In an alternative embodiment, the second fan-out wiring FW may be disposed on the second interlayer insulating layer 115.

The first organic insulating layer 117 may cover the first source electrode (not shown) and the first drain electrode DE1. Signal lines, for example, the data line DL (see FIG. 5) for transferring data signals and the driving voltage line (not shown) for transferring the driving voltage may be disposed on the first organic insulating layer 117. The first source electrode (not shown) and the first drain electrode DE1 may be connected to the data line DL or the driving voltage line (not shown) directly or through another thin-film transistor.

The connection line TWL may be disposed on the first organic insulating layer 117. In an embodiment, the connection line TWL may be disposed in or directly on a same layer as the data line DL (see FIG. 5), the driving voltage line (not shown), and the like, and may include a same material as that of the data line DL and the driving voltage line.

The connection line TWL may include metal including at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu). The connection line TWL may have a single-layered structure or a multi-layered structure, each layer therein including at least one selected from the above materials. In an embodiment, the connection line TWL may have a multi-layered structure of Ti/Al/Ti.

In a case, where the connection line TWL includes a transparent material, for example, a transparent conductive oxide ("TCO") to secure a transmittance of the component area CA, the connection line TWL may be formed on a layer, for example, a data line separate from a signal line connected to a source electrode or a drain electrode of a sub-pixel circuit, and be connected in a bridge type. In such a case, because the connection line TWL is formed thin compared to other wirings by taking into account a transmittance and a diffraction by refraction, the connection line TWL may be vulnerable to wiring erosion and be disconnected. Furthermore, a wiring resistance may be relatively large.

In an embodiment, the connection line TWL may be formed during a same process as a process of forming the signal line, for example, the data line DL (see FIG. 5), a driving voltage line (not shown) and the like, and may include a same material as that of the data line DL and the driving voltage line. Accordingly, in such an embodiment, a separate process of forming the TCO layer may not be performed, such that the manufacturing process may be simplified in an aspect of process.

In an embodiment, a lens structure is provided to organic insulating layers near the connection line TWL instead of the material of the connection line TWL to secure a transmittance of the component area CA, as described below with reference to FIG. 9. Accordingly, the thickness of the connection line TWL may be formed relatively thick. Accordingly, defect due to disconnection of the connection line TWL may be reduced and a wiring resistance of the connection line TWL may be reduced.

The second organic insulating layer 119 may cover the connection line TWL. The first organic insulating layer 117 and the second organic insulating layer 119 may include an organic insulating material, for example, a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the refractive index of the first organic insulating layer 117 and the second organic insulating layer 119 may be controlled by dispersing a filler of a high refractive index in the organic insulating material. The first organic insulating layer 117 and the second organic insulating layer 119 may include, for example, a $TiO_2$ filter. However, the embodiment is not limited thereto.

The display element layer EDL may be disposed on the pixel circuit layer PCL. The display element layer EDL may include a display element. In an embodiment, the display element layer EDL may include an organic light-emitting diode OLED as a display element arranged in the component area CA.

The organic light-emitting diode OLED may be arranged on the second organic insulating layer 119. The organic light-emitting diode OLED as a display element may be electrically connected to the auxiliary sub-pixel circuit PCa1 to implement the first auxiliary sub-pixel Pa1. The organic light-emitting diode OLED may include the first electrode 210, an intermediate layer 220, and a second electrode 230, where the intermediate layer 220 includes an organic emission layer, and the second electrode 230 is disposed opposite to the first electrode 210.

The first electrode 210 may be a pixel electrode. The first electrode 210 may be electrically connected to a contact electrode CM through a contact hole defined in the first organic insulating layer 117. In an embodiment, the first electrode 210 may be a reflective electrode. In an embodiment, the first electrode 210 may include a reflective layer and a transparent or semi-transparent electrode layer on the reflective layer, where the reflective layer may include silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, for example, the first electrode 210 may have a multi-layered structure of ITO/Ag/ITO.

A bank layer 120 may be arranged on the second organic insulating layer 119. The bank layer 120 may prevent arcs and the like from occurring at the edges of the first electrode 210 by increasing a distance between the edges of the first electrode 210 and the second electrode 230 over the first electrode 210.

The bank layer 120 may include an organic insulating material such as polyimide, an acrylic resin, benzocyclobutene, a phenolic resin, and the like and be formed by using spin coating and the like. The bank layer 120 may be transparent or may have a black color by including a light-blocking material.

The intermediate layer 220 of the organic light-emitting diode OLED may be arranged inside an opening 1200P formed or defined by the bank layer 120. An emission area of the organic light-emitting diode OLED may be defined by the opening 1200P of the bank layer 120.

The intermediate layer 220 may include an emission layer 220b. The emission layer 220b may include an organic material including a fluorescent or phosphorous material emitting red, green, blue, or white light. The emission layer 220b may include a low-molecular weight organic material or a polymer organic material. A first functional layer 220a and a second functional layer 220c may be selectively further arranged under and on the emission layer 220b, where the first functional layer 220a may include a hole transport layer ("HTL") and a hole injection layer ("HIL"), and the second functional layer 220c may include an electron transport layer ("ETL") and an electron injection layer ("EIL").

In an embodiment, the second electrode 230 may be a reflective electrode. In an embodiment, the second electrode 230 may include a metal thin film having a small work function including at least one selected from Li, Ca, LiF/Ca, LiF/Al, Al, Ag, Mg, and a compound thereof. In an embodiment, a TCO such as ITO, IZO, ZnO, or $In_2O_3$ may be further arranged on the metal thin film. The second electrode 230 may be formed as a single unitary body over the entire surface of the display area DA and arranged on the intermediate layer 220 and the bank layer 120.

An upper layer 250 including an organic material may be disposed or formed on the second electrode 230. The upper layer 250 may be a layer for protecting the second electrode 230 and simultaneously increasing a light-extracting efficiency. The upper layer 250 may include an organic material having a higher refractive index than that of the second electrode 230. In an embodiment, the upper layer 250 may include layers having different refractive indexes from each other and stacked one on another. In an embodiment, for example, the upper layer 250 may include a high refractive index layer/a low refractive index layer/a high refractive index layer that are stacked. In such an embodiment, the refractive index of the high refractive index layer may be about 1.7 or greater, and the refractive index of the low refractive index layer may be about 1.3 or less.

In an embodiment, the upper layer 250 may additionally include lithium fluoride (LiF). Alternatively, the upper layer 250 may additionally include an inorganic insulating material such as silicon oxide ($SiO_x$) and silicon nitride ($SiN_x$).

Figure 7:
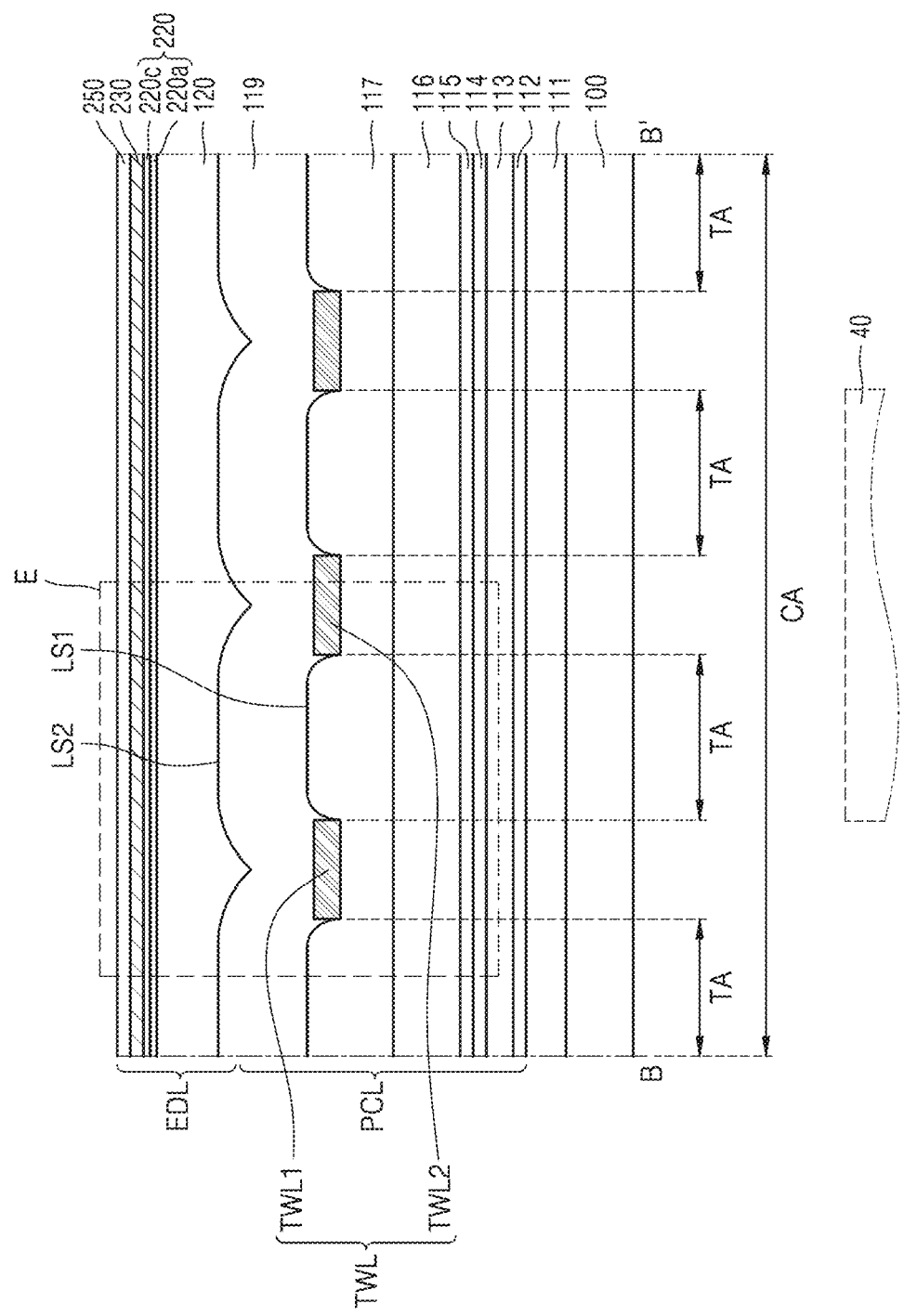
FIG. 7 is a cross-sectional view of a portion of the display apparatus, taken along a line B-B' of FIG. 5.
Figure 8:
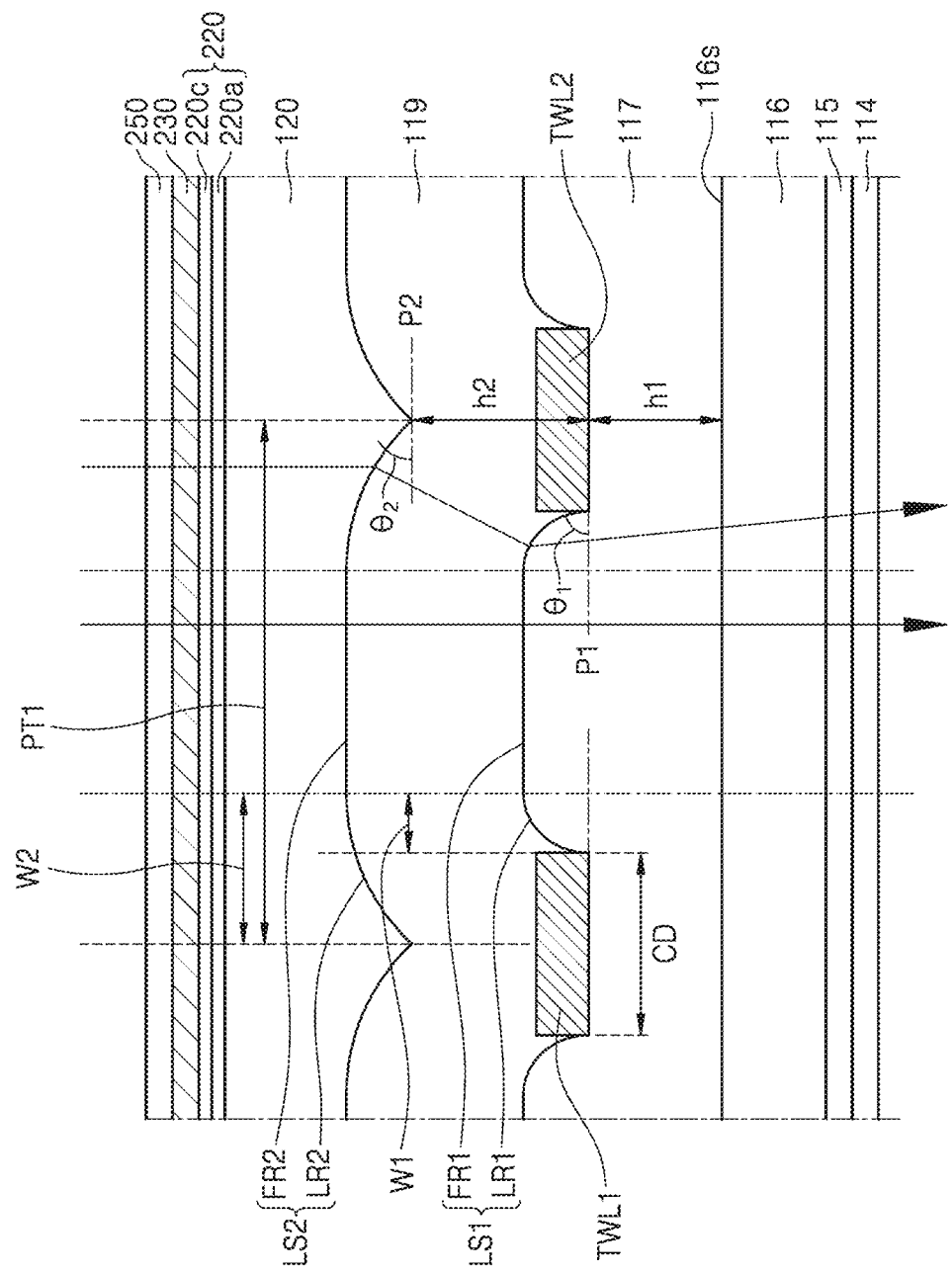
FIG. 8 is an enlarged cross-sectional view of a region E of FIG. 7.

FIG. 7 is a cross-sectional view of a portion of the display apparatus, taken along line B-B' of FIG. 5, and FIG. 8 is an enlarged cross-sectional view of a region E of FIG. 7.

Referring to FIG. 7, in an embodiment where the connection line TWL including a non-transmissive metal is arranged in the component area CA as described above, the transmission area TA may correspond to a region of the component area CA in which the connection line TWL is not arranged. In an embodiment, for example, the transmission area TA may correspond to a region between two connection lines TWL adjacent to each other. The first organic insulating layer 117 may be arranged over the substrate 100 in the component area CA, and the second organic insulating layer 119 may be disposed on the first organic insulating layer 117. A plurality of connection lines TWL may be disposed between the first organic insulating layer 117 and the second organic insulating layer 119. In an embodiment, the plurality of connection lines TWL may be arranged with a constant interval.

Referring to FIGS. 7 and 8, the upper surface of the first organic insulating layer 117 may include a first lens structure LS1. The first lens structure LS1 may include a first curved portion LR1 arranged between the connection lines adjacent to each other, for example, a first connection line TWL1 and a second connection line TWL2 among the plurality of connection lines TWL. The first curved portion LR1 may have a shape convex in an upper direction, for example, a direction including a +y direction component. The first curved portion LR1 may be adjacent to the connection line TWL. In an embodiment, the edge of the first curved portion LR1 may contact the connection line TWL.

In an embodiment, as shown in FIG. 8, the first lens structure LS1 may include a first plane portion FR1 arranged between the first curved portions LR1 in a cross-sectional view. In an alternative embodiment, the first lens structure LS1 may not include the first plane portion FR1. In an embodiment, for example, the first lens structure LS1 may include a curved round portion entirely without a plane portion.

The upper surface of the second organic insulating layer 119 may include a second lens structure LS2. The second lens structure LS2 may include a second curved portion LR2 overlapping a portion of the connection lines TWL, for example, the first connection line TWL1 and the second connection line TWL2 adjacent to each other. The second curved portion LR2 may have a shape convex in an upper direction, for example, a direction including a +y direction component.

In an embodiment, the second lens structure LS2 may include a second plane portion FR2 arranged between the second curved portions LR2 in a cross-sectional view. The second plane portion FR2 may not overlap the connection line TWL. In an alternative embodiment, the second lens structure LS2 may not include the second plane portion FR2. In an embodiment, for example, the second lens structure LS2 may include a curved round portion entirely without a plane portion. The second plane portion FR2 of the second lens structure LS2 may overlap the first plane portion FR1 of the first lens structure LS1.

Each of the second curved portions LR2 of the second lens structure LS2 may overlap at least a portion of the first curved portions LR1 of the first lens structure LS1 and the two connection lines TWL adjacent to each other. In an embodiment, a width W2 of the second curved portion LR2 of the second lens structure LS2 may be greater than a width W1 of the first curved portion LR1 of the first lens structure LS1. In such an embodiment, the second curved portion LR2 of the second lens structure LS2 may have the width W2 greater than the width W1 of the first curved portion LR1 to cover the upper portion of the connection line TWL.

In an embodiment, the first lens structure LS1 of the first organic insulating layer 117 and the second lens structure LS2 of the second organic insulating layer 119 may be formed by using a half-tone mask.

The first lens structure LS1 of the first organic insulating layer 117 and the second lens structure LS2 of the second organic insulating layer 119 may be configured to control a path of light incident from an outside.

The second lens structure LS2 of the second organic insulating layer 119, for example, the second curved portion LR2 may be disposed to overlap a portion of the connection line TWL and configured to control the path of light incident vertically upward of the connection line TWL. Light incident to the second curved portion LR2 may move by being refracted in a direction (e.g., a direction including a −x direction component) facing a space between the connection lines TWL.

The first lens structure LS1 of the first organic insulating layer 117, for example, the first curved portion LR1 may be configured to control the path of light refracted by the second curved portion LR2. Light incident to the first curved portion LR1 may travel by being refracted in a direction (e.g., a direction including a +x direction component) opposite to the direction in which the light is refracted by the second curved portion LR2.

In such an embodiment, the second lens structure LS2 of the second organic insulating layer 119 may allow light incident toward the connection line TWL to be refracted near the connection line TWL and progress to the transmission area TA (see FIG. 7). In an embodiment, the first lens structure LS1 of the first organic insulating layer 117 may allow light refracted by the second lens structure LS2 of the second organic insulating layer 119 to be refracted again and travel toward a point that was directed before being refracted by the second lens structure LS2, for example, a point overlapping the connecting wiring TWL. Accordingly, the loss amount of light reflected or absorbed by the connection line TWL in the component area CA may be reduced, and a transmittance of the component area CA may be secured.

In an embodiment, a width CD of the connection line TWL may be in a range of about 0.7 micrometers (μm) to about 2.0 μm. In an embodiment, for example, the width CD of the connection line TWL may be in a range of about 0.7 μm to about 1.3 μm. In a case where the width CD of the connection line TWL is less than about 0.7 μm, a wiring resistance reduction effect may be insignificant. In a case where the width CD of the connection line TWL is greater than about 2.0 μm, an interval between wirings may be reduced, resulting in a short circuit, and a transmittance of the component area CA may be reduced.

In an embodiment, a minimum value of a distance PT1 between the centers of the connection lines TWL adjacent to each other, for example, the first connection line TWL1 and the second connection line TWL2, may be equal to twice the width W2 of the second curved portion LR2 of the second lens structure LS2. In an embodiment, the distance PT1 between the centers of the first connection line TWL1 and the second connection line TWL2 may be in a range of about 2.8 μm to about 4.0 μm.

Detailed features of the first lens structure LS1 of the first organic insulating layer 117 and the second lens structure LS2 of the second organic insulating layer 119 may be determined based on or designed by taking into account the refractive indexes and thicknesses of the first and second organic insulating layers 117 and 119, the curvature radii of the first curved portion LR1 and the second curved portion LR2, and angles θ1 and θ2 of the first curved portion LR1 and the second curved portion LR2 with respect to imaginary lines P1 and P2 parallel to the substrate.

The refractive index of the first organic insulating layer 117 may be different from the refractive index of the second organic insulating layer 119. The refractive index of the second organic insulating layer 119 may be greater than the refractive index of the first organic insulating layer 117. In an embodiment, the refractive index of the second organic insulating layer 119 may be greater than the refractive index of the bank layer 120. In an embodiment, the refractive index of the second organic insulating layer 119 may be greater than or equal to about 1.7. In an embodiment, the refractive index of the second organic insulating layer 119 may be in a range of about 1.73 to about 1.85. In an embodiment, for example, the refractive index of the second organic insulating layer 119 may be about 1.8. In an embodiment, the refractive index of the first organic insulating layer 117 may be greater than or equal to about 1.4. In an embodiment, the refractive index of the first organic insulating layer 117 may be in a range of about 1.475 to about 1.6. In an embodiment, for example, the refractive index of the first organic insulating layer 117 may be about 1.55.

The radius of curvature of the second curved portion LR2 of the second lens structure LS2 may be greater than the radius of curvature of the first curved portion LR1 of the first lens structure LS1. In an embodiment, the radius of curvature of the second curved portion LR2 may be equal to or greater than about 1.6 μm. In an embodiment, the radius of curvature of the second curved portion LR2 may be in a range of about 1.6 μm to about 2.7 μm. In an embodiment, for example, the radius of curvature of the second curved portion LR2 may be about 2.0 μm. In an embodiment, the radius of curvature of the first curved portion LR1 of the first lens structure LS1 may be in a range of about 0.4 μm to about 1.9 μm. In an embodiment, the radius of curvature of the first curved portion LR1 may be in a range of about 0.4 μm to about 1.3 μm. In an embodiment, for example, the radius of curvature of the first curved portion LR1 may be about 0.7 μm.

In a vertical cross-sectional view, the first curved portion LR1 of the first lens structure LS1, for example, the lateral surface of the first curved portion LR1 may have a first angle θ1 with respect to a first imaginary line P1 parallel to a horizontal surface of the substrate 100. In a vertical cross-sectional view, the second curved portion LR2 of the second lens structure LS2, for example, the lateral surface of the second curved portion LR2 may have a second angle θ2 with respect to a second imaginary line P2 parallel to the horizontal surface of the substrate 100. The second angle θ2 of the second curved portion LR2 may be less than the first angle θ1 of the first curved portion LR1.

In an embodiment, the second angle θ2 of the second curved portion LR2 may be in a range of about 30° to about 50°. In an embodiment, the second angle θ2 of the second curved portion LR2 may be in a range of about 30° to about 48°. In an embodiment, the second angle θ2 of the second curved portion LR2 may be in a range of about 30° to about 40°. The first angle θ1 of the first curved portion LR1 may be in a range of about 40° to about 90°. In an embodiment, the first angle θ1 of the first curved portion LR1 may be in a range of about 40° to about 80°. In an embodiment, for example, the first angle θ1 of the first curved portion LR1 may be about 75°.

A thickness h2 of the second organic insulating layer 119 may be greater than a thickness h1 of the first organic insulating layer 117. In an embodiment, the thickness h2 of the second organic insulating layer 119 may be in a range of about 5 μm to about 10 μm. In an embodiment, the thickness h2 of the second organic insulating layer 119 may be in a range of about 6.5 μm to about 7.5 μm. In an embodiment, for example, the thickness h2 of the second organic insulating layer 119 may be about 7 μm. In an embodiment, the thickness h1 of the first organic insulating layer 117 may be in a range of about 1 μm to about 2.8 μm. In an embodiment, for example, the thickness h1 of the first organic insulating layer 117 may be about 1.5 μm. However, the embodiment is not limited thereto.

Figure 9A:
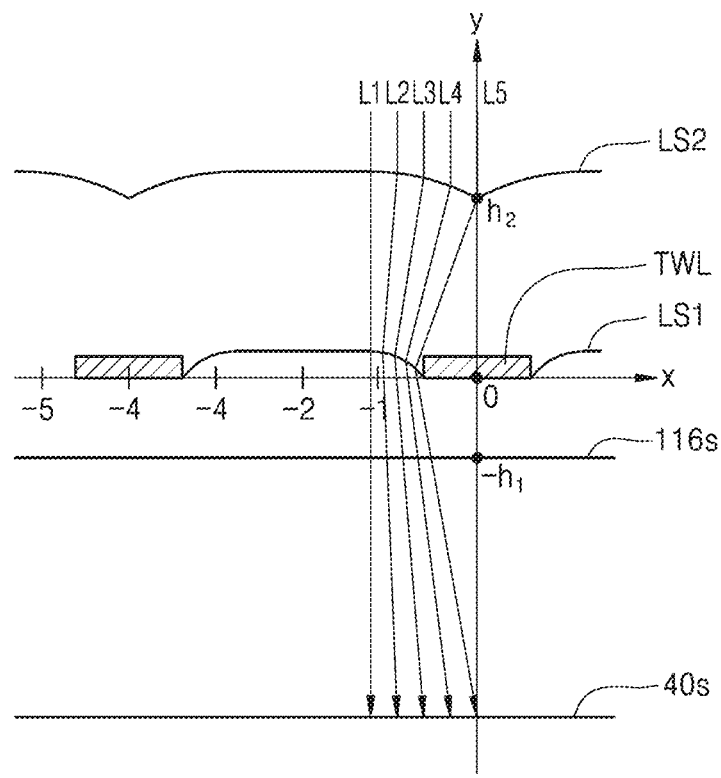
FIG. 9A is a schematic view of a path of light on x, y coordinates, where the light passes through a lens structure of organic insulating layers included in the display apparatus according to an embodiment.

FIG. 9A is a schematic view of a path of light on x, y coordinates, where the light passes through a lens structure of organic insulating layers included in the display apparatus according to an embodiment. FIG. 9A schematically shows the second lens structure LS2 of the second organic insulating layer 119, the first lens structure LS1 of the first organic insulating layer 117, a surface 116s of the third interlayer insulating layer 116, and a surface 40s of the component 40 (see FIG. 7) disposed below the component area CA on an x, y coordinate-plane. The component 40 may be, for example, a camera image sensor, and the surface 40s of the component 40 may be the surface of the camera image sensor. In FIG. 9A, x and y coordinate values of the display apparatus are arbitrary set, for convenience of description, and the embodiment is not limited thereto.

Figure 9B:
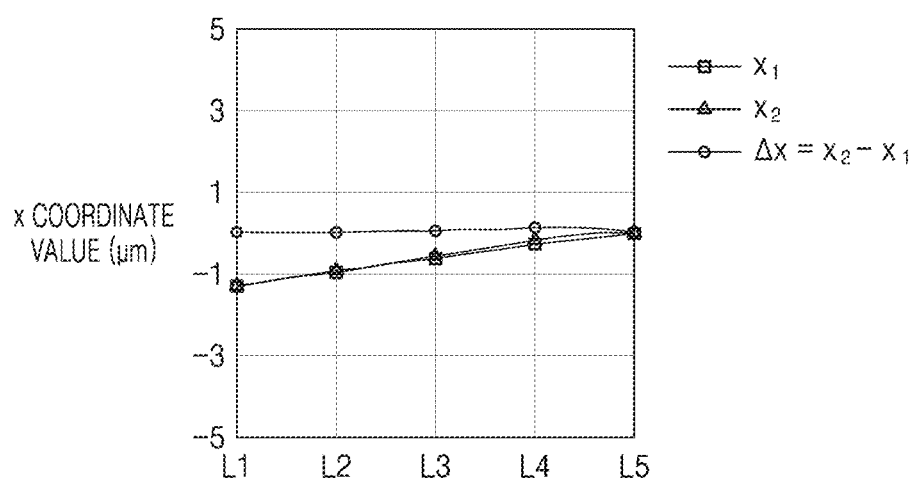
FIG. 9B is a graph showing change of an x coordinate value of light, where the light passes through a lens structure of an organic insulating layer included in the display apparatus, according to an embodiment.

FIG. 9B is a graph showing changes in x coordinate values of five lights L1, L2, L3, L4, and L5 incident from above the second organic insulating layer 119 in FIG. 9A. FIG. 9B compares an x coordinate value x1 on the surface of the second lens structure LS2 of the second organic insulating layer 119 with an x coordinate value x2 on the surface 40s of the component 40.

Referring to FIGS. 8, 9A and 9B, as described above, each of lights L2, L3, L4, and L5 incident to the second curved portion LR2 toward a point on the surface 40s of the component 40 overlapping the connection line TWL may be refracted to travel in a direction (e.g., a direction including a −x direction component) facing a space between the connection lines TWL adjacent to each other. Then, the lights L2, L3, L4, and L5 incident to the first curved portion LR1 may be refracted again to travel in a direction (e.g., a direction including a +x direction component) opposite to the direction refracted by the second curved portion LR2. Accordingly, because the lights L2, L3, L4, and L5 incident to the second curved portion LR2 may be refracted near the connection line TWL to travel, the lights L2, L3, L4, and L5 may not be reflected or absorbed by the connection line TWL but may reach the surface 40s of the component 40 below the connection line TWL.

In such an embodiment, the first lens structure LS1 and the second lens structure LS2 may be configured or designed in a way such that each of the incident lights L2, L3, L4, and L5 reach an objective point initially directed on the surface 40s of the component 40 by being refracted by the first lens structure LS1 and the second lens structure LS2. In such an embodiment, the lights L2, L3, L4, and L5 may be controlled such that a difference between an x coordinate value x1 of each light when the lights L2, L3, L4, and L5 reach the surface of the second curved portion LR2, and an x coordinate value x2 of each light when the lights L2, L3, L4, and L5 reach the surface 40s of the component 40 is small.

According to embodiments, a difference between an x coordinate value x1 of each incident light on the surface of the second curved portion LR2 and an x coordinate value x2 of each incident light on the surface 40s of the component 40 may be about 0.1 μm or less.

In embodiments of the invention, a display apparatus may have a reduced resistance of wirings in the component area, an improved reliability, and simultaneously, secure a transmittance of the component area.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
    first display elements disposed in a main display area;
    second display elements disposed in a component area at least partially surrounded by the main display area;
    pixel circuits disposed in a non-display area and electrically connected to the second display elements;
    connection lines connecting the pixel circuits in the non-display area to the second display elements in the component area;
    a first organic insulating layer disposed over a substrate in the component area; and
    a second organic insulating layer disposed on the first organic insulating layer in the component area,
    wherein the connection lines are disposed between the first organic insulating layer and the second organic insulating layer,
    wherein an upper surface of the first organic insulating layer includes a first lens structure, wherein the first lens structure includes a first curved portion disposed between two connection lines adjacent to each other among the connection lines, and an upper surface of the second organic insulating layer includes a second lens structure,
    wherein the second lens structure includes a second curved portion overlapping the first curved portion and a portion of the two connection lines adjacent to each other, and
    wherein a refractive index of the second organic insulating layer is different from a refractive index of the first organic insulating layer.

2. The display apparatus of claim 1, wherein the refractive index of the second organic insulating layer is greater than the refractive index of the first organic insulating layer.

3. The display apparatus of claim 1, further comprising:
    a bank layer disposed on the second organic insulating layer,
    wherein the refractive index of the second organic insulating layer is greater than a refractive index of the bank layer, and greater than the refractive index of the first organic insulating layer.

4. The display apparatus of claim 1, wherein a radius of curvature of the second curved portion of the second lens structure is greater than a radius of curvature of the first curved portion of the first lens structure.

5. The display apparatus of claim 1, wherein a width of the second curved portion of the second lens structure is greater than a width of the first curved portion of the first lens structure.

6. The display apparatus of claim 1, wherein,
    in a vertical cross-section, the first curved portion of the first lens structure has a first angle with respect to an imaginary line parallel to a horizontal surface of the substrate, and,
    in a vertical cross-section, the second curved portion of the second lens structure has a second angle with respect to another imaginary line parallel to the horizontal surface of the substrate.

7. The display apparatus of claim 6, wherein the second angle of the second curved portion is less than the first angle of the first curved portion.

8. The display apparatus of claim 1, wherein a width of each of the connection lines is in a range of about 0.7 μm to about 1.3 μm.

9. The display apparatus of claim 1, wherein a refractive index of the second organic insulating layer is about 1.7 or greater.

10. The display apparatus of claim 1, wherein the connection lines include at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

11. An electronic apparatus comprising:
    a display apparatus comprising a main display area, a component area, and a non-display area; and
    a component disposed over a backside of the display apparatus and overlapping the component area,
    wherein the display apparatus comprises:
        first display elements disposed in the main display area;
        second display elements disposed in the component area at least partially surrounded by the main display area;
        pixel circuits disposed in a non-display area and electrically connected to the second display elements;
        connection lines connecting the pixel circuits in the non-display area to the second display elements in the component area;
        a first organic insulating layer over a substrate in the component area; and
        a second organic insulating layer on the first organic insulating layer in the component area,
    wherein the connection lines are disposed between the first organic insulating layer and the second organic insulating layer, an upper surface of the first organic insulating layer includes a first lens structure including a first curved portion, wherein the first curved portion is disposed between two connection lines adjacent to each other among the connection lines and is convex upward, and wherein an upper surface of the second organic insulating layer includes a second lens structure including a second curved portion overlapping the first curved portion and a portion of the two connection lines adjacent to each other, wherein the second curved portion is convex upward, and wherein a refractive index of the second organic insulating layer is different from a refractive index of the first organic insulating layer.

12. The electronic apparatus of claim 11, wherein the refractive index of the second organic insulating layer is greater than the refractive index of the first organic insulating layer.

13. The electronic apparatus of claim 11, further comprising:

a bank layer on the second organic insulating layer, wherein the refractive index of the second organic insulating layer is greater than a refractive index of the bank layer, and greater than the refractive index of the first organic insulating layer.

14. The electronic apparatus of claim 11, wherein a radius of curvature of the second curved portion of the second lens structure is greater than a radius of curvature of the first curved portion of the first lens structure.

15. The electronic apparatus of claim 11, wherein a width of the second curved portion of the second lens structure is greater than a width of the first curved portion of the first lens structure.

16. The electronic apparatus of claim 11, wherein, in a vertical cross-section, the first curved portion of the first lens structure has a first angle with respect to an imaginary line parallel to a horizontal surface of the substrate, and, in a vertical cross-section, the second curved portion of the second lens structure has a second angle with respect to another imaginary line parallel to the horizontal surface of the substrate.

17. The electronic apparatus of claim 16, wherein the second angle of the second curved portion is less than the first angle of the first curved portion.

18. The electronic apparatus of claim 11, wherein a width of each of the connection lines is in a range of about 0.7 μm to about 1.3 μm.

19. The electronic apparatus of claim 11, wherein the refractive index of the second organic insulating layer is about 1.7 or greater.

20. The electronic apparatus of claim 11, wherein the connection lines include at least one selected from aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and copper (Cu).

21. The electronic apparatus of claim 11, wherein the component comprises at least one selected from a camera, a speaker, a solar battery, a flash, a light-sensing sensor, and a heat-sensing sensor.

\* \* \* \* \*